United States Patent

Hammerschmidt et al.

Patent Number: 5,376,499
Date of Patent: Dec. 27, 1994

[54] HIGHLY HEAT-RESISTANT POSITIVE RESISTS COMPRISING END-CAPPED HYDROXYPOLYAMIDES

[75] Inventors: Albert Hammerschmidt, Erlangen; Siegfried Birkle, Höchstadt a/Aisch; Hellmut Ahne, Röttenbach, all of Germany

[73] Assignee: Siemens Aktiengesellschaft, Munich, Germany

[21] Appl. No.: 880,139

[22] Filed: May 7, 1992

[30] Foreign Application Priority Data

May 7, 1991 [DE] Germany .................. 4114928

[51] Int. Cl.$^5$ .................. G03F 7/023; G03F 7/30
[52] U.S. Cl. .................. 430/192; 430/165; 430/193; 430/906; 525/426; 525/434; 528/310; 528/332
[58] Field of Search .............. 430/192, 193, 165, 906; 528/310, 332; 525/426, 434

[56] References Cited

U.S. PATENT DOCUMENTS

| | | | |
|---|---|---|---|
| 4,339,521 | 7/1982 | Ahne et al. | 430/192 |
| 4,371,685 | 2/1983 | Ahne et al. | 528/73 |
| 4,395,482 | 7/1983 | Ahne et al. | 430/326 |
| 4,622,285 | 11/1986 | Ahne | 430/190 |
| 4,849,051 | 7/1989 | Ahne et al. | 156/659 |
| 5,021,320 | 6/1991 | Mueller et al. | 430/192 |
| 5,081,000 | 1/1992 | Kuehn et al. | 430/906 |

FOREIGN PATENT DOCUMENTS 0391196 10/1990 European Pat. Off. .
3716629 12/1988 Germany .

*Primary Examiner*—Charles L. Bowers, Jr.
*Assistant Examiner*—John S. Chu
*Attorney, Agent, or Firm*—Kenyon & Kenyon

[57] ABSTRACT

Cost-effective, highly heat-resistant positive resists based on oligomer and/or polymer polybenzoxazole precursors and diazo quinones possess a high [level of] stability in storage when the polybenzoxazole precursors are hydroxypolyamides of the following structure:

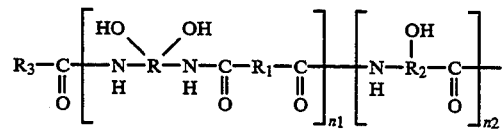

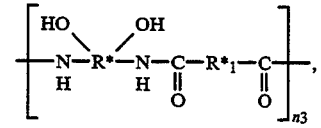

whereby R, R*, R$_1$, R*$_1$, and R$_2$ are aromatic groups, R$_3$ is an aliphatic, cycloaliphatic or aromatic group having at least one alkenyl or alkynyl grouping and, with respect to n$_1$, n$_2$ and n$_3$, the following applies:
n$_1$=1 to 100, n$_2$ and n$_3$=0 or
n$_1$ and n$_2$=1 to 100, n$_3$=0 or
n$_2$=1 to 100, n$_1$ and n$_3$=0 or
n$_1$, n$_2$ and n$_3$=1 to 100 (whereby R≠R* and/or R≠R*$_1$) or
n$_1$ and n$_3$=1 to 100, n$_2$=0 (whereby R≠R* and/or R$_1$≠R*$_1$),
provided that: n$_1$+n$_2$+n$_3$>3.

7 Claims, No Drawings

HIGHLY HEAT-RESISTANT POSITIVE RESISTS COMPRISING END-CAPPED HYDROXYPOLYAMIDES

BACKGROUND OF THE INVENTION

The invention relates generally to highly heat-resistant positive resists based on oligomer polybenzoxazole precursors, polymer polybenzoxazole precursors, or mixtures thereof and diazoquinones and particularly to storage stable positive resists.

In highly temperature-resistant photoresists, which are needed for a cost-effective, direct structuring of organic insulating layers, hydroxypolyamides are used as soluble polybenzoxazole precursors. The polybenzoxazoles obtained from the hydroxypolyamides are distinguished by a high temperature resistance and low water absorption as well as by excellent electrical properties. The polybenzoxazoles can serve as etching masks in alkaline etching processes, and also as organic dielectrics in semiconductor production.

Photostructurable polybenzoxazole precursors may be used in positive and negative resists. In addition to the polymer precursor, the positive resists generally contain a photoactive component in the form of diazoquinone (see European Patent Specification 0 023 662, EP Published Patent Application 0 291 779 and German Published Patent Application 37 16 629), while the negative resists contain polymer precursors with cross-linkable, unsaturated groups (see European Patent Specification 0 041 677).

However, in both of the mentioned resist types, problems can occur with respect to storage stability. In the case of positive resists containing hydroxypolyamides, a polycondensation can take place in concentrated resist solutions; negative resists tend to polymerize because of the presence of unsaturated groups, such as acrylic and methylacrylic groups. In both resist types, this leads to an increase in viscosity and can result in a gel formation. Moreover, in positive resists, the photoactive component can be destroyed by terminal alkaline amino groups or by amine monomers and amide oligomers.

An object of the invention is to specify cost-effective, highly heat-resistant positive resists based on oligomer polybenzoxazole precursors, polymer polybenzoxazole precursors, or mixtures thereof and diazoquinones, in which the storage stability difficulties associated with these types of resists do not occur. The resist solutions should not only be sufficiently stable in storage, but also produce relief structures with a dimensional stability greater than 400° C.

DETAILED DESCRIPTION

This object among others is achieved according to the present invention using hydroxypolyamides. The polybenzoxazole precursors used in the positive resists according to the invention are hydroxypolyamides of a particular structure. In these hydroxypolyamides the terminal amino groups, are modified in a specific way. This modification of the terminal amino groups leads to polybenzoxazole precursors that produce positive resists, which are stable in storage and contain diazoquinone as a photoactive component. Surprisingly, using these storage stable positive resists, relief structures may be produced photolithographically, which are inherently stable up to temperatures >400° C., when annealed.

The hydroxypolyamides used in the present invention are of the following structure:

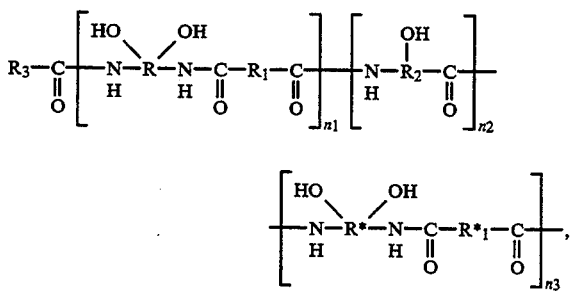

where R, R*, $R_1$, $R^*_1$, and $R_2$ are aromatic groups, $R_3$ is an aliphatic, cycloaliphatic or aromatic group having at least one alkenyl or alkynyl group, provided that $n_1+n_2+n_3>3$, and $n_1$, $n_2$, and $n_3$ are defined as follows:

$n_1=1$ to 100, $n_2=0$ and $n_3=0$;
$n_1=1$ to 100, $n_2=1$ to 100, and $n_3=0$;
$n_2=1$ to 100, $n_1=0$ and $n_3 0$;
$n_1=1$ to 100, $n_2=1$ to 100, $n_3=1$ to 100, and $R \neq R^*$, or $R_1 \neq R^*_1$, or $R \neq R^*$ and $R_1 \neq R^*_1$; or
$n_1=1$ to 100, $n_3=1$ to 100, $n_2=0$ and $R \neq R^*$, or $R_1 \neq R^*_1$, or $R \neq R^*$ and $R_1 \neq R^*_1$.

R and R* may be further selected from the following:

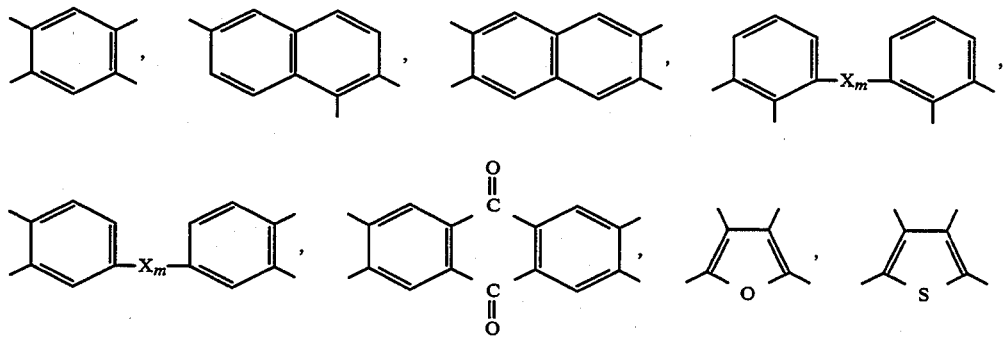

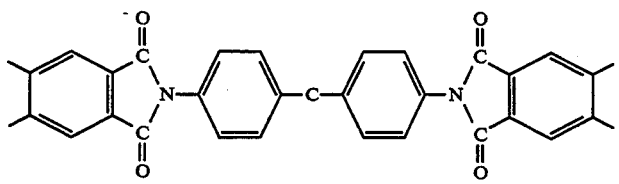

R₁ and R*₁ may be further selected from the following and the H-atoms on the ring may be replaced by Cl or Br:

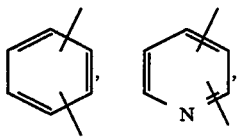

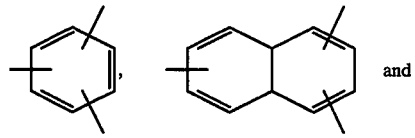

R₂ may be selected from the following:

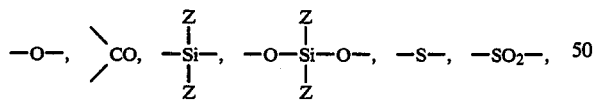

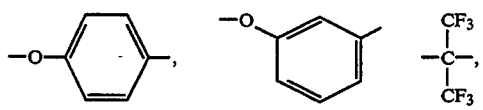

the aromatic residues can also carry alkyl substituents. The value for m may be 0 or 1.
The substituent X may be selected from:

$$-O-, \quad \underset{/}{\overset{\backslash}{}}CO, \quad -\underset{Z}{\overset{Z}{|}}Si-\underset{|}{\overset{|}{}}, \quad -O-\underset{Z}{\overset{Z}{|}}Si-\underset{|}{\overset{|}{}}O-, \quad -S-, \quad -SO_2-,$$

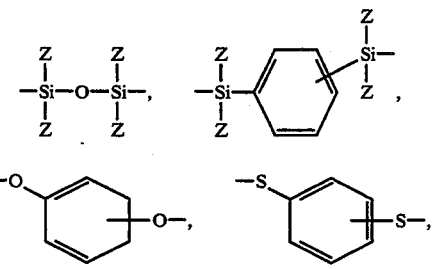

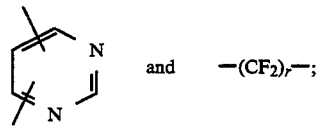

wherein Z=alkyl of 1 to 10 carbon atoms or an aryl group, and
r=2 to 18.
R₃ may be selected from the following:

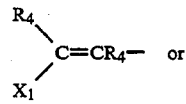

$$-C(R_4)_2-M_x-(CH_2)_y-M_x-Q-(CH_2)_y-H \quad \text{or}$$

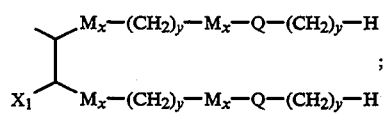

or
wherein $X_1$=H, alkyl or COOH; M=O or S; Q=—C=C— or —CR₄=CR₄—; R₄=H or alkyl; x=0 or 1; y=0, 1, 2 or 3;

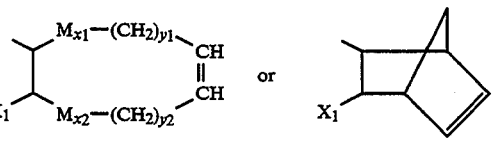

wherein $X_1$=H, alkyl or COOH; M=O or S; $x_1$=0 or 1; $x_2$=0 or 1; $y_1$=0, 1, 2, or 3; $Y_2$=0, 1, 2 or 3; wherein $x+x_2+y_1+y_2 \leq 4$; $y_1+y_2 \geq 1$;

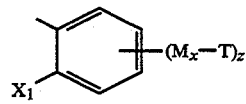

wherein $X_1$=H, alkyl or COOH; M=O or S; T=(CH₂)ᵧ—Mₓ—CH=CH—(CH₂)ᵧ—H; x=0 or 1; y=0, 1, 2 or 3; and z=1 or 2.

Polycondensation products are the starting materials for the hydroxypolyamides. Specifically, the following starting material may be used: co-polycondensation products of aromatic diaminodihydroxy compounds and aromatic dicarboxylic acids or dicarboxylic acid chlorides; homo-polycondensation products of aromatic aminohydroxy carboxylic acids; co-polycondensation products of aromatic diaminodihydroxy compounds, aromatic dicarboxylic acids or dicarboxylic acid chlorides and aromatic aminohydroxy carboxylic acids.

In the present invention, hydroxypolyamides of the following type are preferred: polycondensation products of 3,3'-dihydroxybenzidine and isophthalic acid dichloride; polycondensation products of 3,3'-dihydroxybenzidine, 2'2-bis(3-amino-4-hydroxyphenyl)-1,1,1,3,3,3,-hexafluoropropane and isophthalic acid dichloride; polycondensation products of 3-amino-4-hydroxybenzoic acid.

In addition to 3,3'-dihydroxy benzidine (3,3'-dihydroxy-4,4'-diaminobiphenyl), isomers of this compound can also be applied as diaminodihydroxy compounds, as can also other hydroxyl-group-containing aromatic diamines, such as 3,3'-dihydroxy-4,4'-diaminodiphenylether. In addition to isophthalic acid dichloride, isophthalic acid can also be applied as a dicarboxylic acid. Terephthalic acid can also be used as dicarboxylic acid, as can terephthalic acid dichloride as a dicarboxylic acid derivative.

The starting materials contain terminal amino groups, which are modified in such a way that the amino groups are converted into acid amide groups of unsaturated, aliphatic, cycloaliphatic or aromatic carboxylic acids. The modification takes place by reacting the terminal amino groups with suitable carboxylic acid derivatives, in particular carboxylic acid chlorides and dicarboxylic acid anhydrides. In the procedure a deficiency of dicarboxylic acid or dicarboxylic acid chloride is used when preparing the hydroxypolyamides (for the preparation itself, see for example the European Published Patent Application 0 391 196, the disclosure of which is incorporated herein by reference). The remaining free amino groups are then reacted with the derivative of the unsaturated carboxylic acid. In particular, when acid chlorides are applied, the reaction must be conducted a way that ensures that the carboxylic acid derivative reacts with the amino groups and not with the hydroxyl groups (of the hydroxypolyamides). To this end, the carboxylic acid derivative is added slowly by drops to the reaction solution and, if necessary, the reaction is carried out at low temperatures from about 0° C. or lower.

Suitable compounds for modifying the terminal amino groups of the hydroxypolyamides include: maleic anhydride, norbornene dicarboxylic acid anhydride, and 4-vinyl-benzoic acid chloride. The advantage of applying derivatives of unsaturated carboxylic acids is that additional cross-linking reactions take place during the annealing process. When cyclical carboxylic acid anhydrides, such as maleic anhydride and norbornene dicarboxylic acid anhydride, are applied, one obtains the further advantage that during annealing an imide with a neighbouring hydroxyl group is formed which also can cross-link and improve the adhesion.

In the positive resists according to the invention, generally known photosensitive diazoquinones may be used as photoactive compounds and are discussed in European Patent 0 023 662. In particular o-quinone- and o-naphthoquinonediazides may be used as photoactive components. Preferably, esters or amides of the 6-diazo-5(6)-oxo-1-naphthalene-sulfonic acid are used. Particularly useful is the bis-naphthoquinone-[1,2]-diazide-(2)-5-sulfonic acid ester of β,β-bis(4-hydroxyphenyl)-propane. The mass ratio of hydroxypolyamide to diazoquinone is advantageous in ratios of ratios of 1:20 to 20:1, and is preferably a ratio of 1:10 to 10:1.

To manufacture highly heat-resistant relief structures, a positive resist according to the invention in the form of a layer or film is applied to a substrate and exposed to actinic light through an overlay mask or irradiated through the conduction of a light, electron or ion beam. The exposed or irradiated layer is subsequently dissolved out or stripped, and the resulting relief structures are then annealed.

The photoresist can be advantageously applied to the substrate while being dissolved in an organic solvent. Preferably, N-methylpyrrolidone is used as a solvent. In addition, other organic solvents with similar properties can be used, such as dimethyl formamide and N.N-dimethylacetamide, and mixtures of the above mentioned solvents.

An adhesive agent, wetting agent, or mixture thereof can be used advantageously in the manufacturing of the relief structures. Adhesive agent or wetting agent can be added to the polymer solution, however, they can also be applied to the substrate - before the coating process. The polymer solution is applied preferably to the substrate using the centrifugal technique, as well as the dipping or spraying method. However, other coating methods, such as brushing and rolling, can also be applied. The substrate preferably consists of glass, metal, in particular aluminum, of plastic or of a semiconductive material.

The structured polymer layers are converted into highly heat-resistant polybenzoxazoles through an annealing process. Generally, temperatures of between 200° and 500° C. are selected. Preferably, the annealing process takes place at a temperature of between 300° and 400° C. In this manner, one obtains polybenzoxazoles of a high dielectric grade and with good film-forming properties, particularly when hexafluoropropyl partial structures are used.

EXAMPLES

1. Preparation of a Hydroxypolyamide 105 parts by weight of 2.2-bis(3-amino-4-hydroxyphenyl)1,1,3,3,3-hexafluoropropane and 62 parts by weight of 3,3'-dihydroxybenzidine are dissolved under argon in 1380 parts by weight of N-N-dimethylacetamide and 250 parts by weight of pyridine. 104 parts by weight of isophthalic acid dichloride, dissolved in 460 parts by weight of cyclohexanone, are rigorously stirred in by drops to the solution cooled to 0° C. After being stirred for 2½ hours, the reaction mixture is allowed to warm up to room temperature and is then stirred for another 3½ hours After standing for 12 hours, 37.1 parts by weight of norbornene dicarboxylic acid anhydride is slowly stirred in by drops, and the mixture is then allowed to stand for 12 hours at room temperature. The reaction solution is subsequently added by drops to 18 liters of water, the precipitating polymer is then washed and dried in a vacuum-drying oven over NaOH.

2. Purification of the Hydroxypolyamide

The hydroxypolyamide prepared according to example 1 is purified by means of ion exchangers. To this end, 150 parts by weight of a commercial anion exchanger are suspended in distilled water, poured into a chromatographic column and washed neutral; the water is subsequently replaced by N-methylpyrrolidone. In a corresponding way, 100 parts by weight of a commercial cation exchanger are suspended in distilled water, poured into a chromatographic column and washed for so long with 10% Hcl until the eluate reacts acidically; they are subsequently washed With water, neutral and free from chloride, and the water is then replaced by N-methylpyrrolidone.

For the purification process, 200 parts by weight of dried hydroxypolyamide are dissolved in 2000 parts by weight of N-methylpyrrolidone. The solution is then added to the anion and the cation exchanger. The polymer solution purified in this manner is added by drops to about 17 l water; the precipitating polymer is separated, washed and dried in a vacuum-drying oven over NaOH.

Solutions of polybenzoxazole precursors in the form of terminal-group-modified hydroxypolyamides prepared in the above-described manner are distinguished by a particularly good viscosity stability compared to solutions of corresponding non-terminal -group-modified hydroxypolyamides.

3. Preparation of a Resist Solution 15 parts by weight of a polybenzoxazole precursor, which has been prepared and purified in the above described manner, are added to a solution of 3 parts by weight of bis-naphthoquinone-[1,2]-diazide-(2)-5-sulfonic acid ester of $\beta,\beta$-bis(4-hydroxyphenyl)-propane in 65 parts by weight of n-methylpyrrolidone; the obtained solution is then pressure-filtered through a 0.8 um filter. This type of solution proves to be stable in storage and, in fact, both with respect to the viscosity of the solution as well as with respect to the technological properties.

4. Manufacturing a Relief Structure

An adhesive agent is initially applied to a silicon disk (5000 r.p.m. −30 s; 80° C. −10 min). The silicon disk is then coated using a centrifugal process (3000 r.p.m. - 20 s) with a photoreactive solution prepared according to example 3 and then dried (layer thickness: 1.6 um). It is subsequently irradiated for 6 to 7 s through an overlay mask (MJP 55: 23mW/cm², measured with OAI 400 nm), developed with an MIF-developer NMD-3 (0.32 %), and then annealed in a diffusion oven under nitrogen (annealing program: room temperature to 170° C.: 1 h, 170 to 300° C.: 1 h, 300 to 400° C.: 1 h, 400° C.: 1 h, 400° C. to room temperature: 4 hours).

Fine relief structures are created thereby, which show dimensional stability under heat (shape permanence to heat) and a resolution of <1.6 um.

What is claimed is:

1. A positive resist comprising a diazoquinone in admixture with a polybenzoxazole precursor, which is a hydroxypolyamide of the following structure:

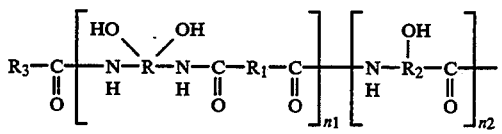

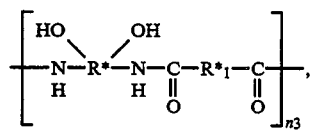

wherein R, R*, $R_1$, R*$_1$, and $R_2$ are aromatic groups, $R_3$ is an aliphatic having at least one alkenyl or alkynyl grouping, a cycloaliphatic group having at least one alkenyl or alkynyl grouping or an aromatic group having at least one alkenyl or alkynyl grouping and $n_1$, $n_2$, and $n_3$ are defined as follows:

$n_1=1$ to 100, $n_2=0$ and $n_3=0$; or
$n_1=1$ to 100, $n_2=1$ to 100, and $n_3=0$; or
$n_2=1$ to 100, $n_1=0$ and $n_3=0$; or
$n_1=1$ to 100, $n_2=1$ to 100, $n_3=1$ to 100, and $R\neq R^*$, or $R_1\neq R^*_1$, or $R\neq R^*$ and $R_1\neq R^*_1$; or
$n_1=1$ to 100, $n_3=1$ to 100, $n_2=0$ and $R\neq R^*$, or $R_1\neq R^*_1$, or $R\neq R^*$ and $R_1\neq R^*_1$;
provided that: $n_1+n_2+n_3>3$.

2. A positive resist comprising a diazoquinone in admixture with a polybenzoxazole precursor, which is a hydroxypolyamide of the following structure:

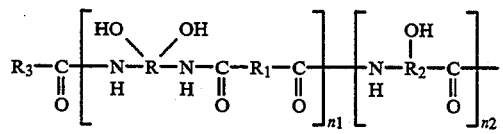

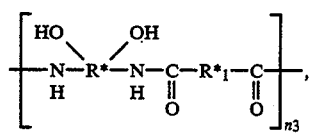

wherein R, R*, $R_1$, R*$_1$, and $R_2$ are aromatic groups; $R_3$ is an aliphatic having at least one alkenyl or alkynyl grouping, a cycloaliphatic group having at least one alkenyl or alkynyl grouping or an aromatic group having at least one alkenyl or alkynyl grouping and $n_1$, $n_2$, and $n_3$ are defined as follows:

$n_1=1$ to 100, $n_2=0$ and $n_3=0$; or
$n_1=1$ to 100, $n_2=1$ to 100, and $n_3=0$; or
$n_2=1$ to 100, $n_1=0$ and $n_3=0$; or
$n_1=1$ to 100, $n_2=1$ to 100, $n_3=1$ to 100; or
$n_1=1$ to 100, $n_3=1$ to 100, $n_2=0$; provided that $n_1+n_2+n_3>3$.

3. The positive resists according to claim 1 wherein the diazoquinone is selected from the group comprising an ester and an amide of 6-diazo-5 ( 6 ) -oxo-1-naphthalenesulfonic acid.

4. The positive resists according to claim 1 wherein the mass ratio of hydroxypolyamide to diazoquinone is 1:20 to 20:1.

5. The positive resists according to claim 1 wherein the mass ratio of hydroxypolyamide to diazoquinone is 1:10 to 10:1.

6. The positive resists according to claim 3 wherein the mass ratio of hydroxypolyamide to diazoquinone is 1:20 to 1.

7. The positive resists according to claim 2 wherein the mass ratio of hydroxypolyamide to diazoquinone is 1:10 to 1.

* * * * *